United States Patent [19]
Miyata et al.

[11] Patent Number: 5,529,634
[45] Date of Patent: Jun. 25, 1996

[54] APPARATUS AND METHOD OF MANUFACTURING SEMICONDUCTOR DEVICE

[75] Inventors: Masahiro Miyata, Urayasu; Hidemitsu Egawa; Johta Fukuhara, both of Tokyo; Shinzi Takeda, Yokohama; Hirokazu Ezawa, Tokyo, all of Japan

[73] Assignee: Kabushiki Kaisha Toshiba, Kawasaki, Japan

[21] Appl. No.: 424,623

[22] Filed: Apr. 19, 1995

Related U.S. Application Data

[62] Division of Ser. No. 172,940, Dec. 27, 1993.

[30] Foreign Application Priority Data

Dec. 28, 1992 [JP] Japan ................. 4-359942

[51] Int. Cl.⁶ ................. C23C 16/00; H01L 21/60
[52] U.S. Cl. ................. 118/726; 118/715; 118/719; 118/300; 261/142; 261/16; 427/250
[58] Field of Search ................. 118/715, 719, 118/726, 300, 308; 427/250, 180, 191, 78, 456, 479, 483, 484; 228/179.1; 261/16, 142; 437/183, 195

[56] References Cited

U.S. PATENT DOCUMENTS

| | | | |
|---|---|---|---|
| 4,389,973 | 6/1983 | Suntola | 118/725 |
| 4,582,731 | 4/1986 | Smith | 27/421 |
| 4,714,047 | 12/1987 | Ikeda | 118/724 |
| 4,848,273 | 7/1989 | Mori | 118/729 |
| 5,328,078 | 7/1994 | Okumura | 228/179.1 |

FOREIGN PATENT DOCUMENTS

| | | | |
|---|---|---|---|
| 2460989 | 8/1975 | Germany | 118/719 |
| 161722 | 7/1986 | Japan | 118/726 |
| 260053 | 11/1987 | Japan | 118/726 |

*Primary Examiner*—R. Bruce Breneman
*Assistant Examiner*—Jeffrie R. Lund
*Attorney, Agent, or Firm*—Finnegan, Henderson, Farabow, Garrett & Dunner

[57] ABSTRACT

An evaporation chamber for forming fine metal particles is separated from a film formation chamber in which the substrate having a metal film such as a metal column thereon is placed during metal film deposition. The pressure of the film formation chamber is set to be lower than that of the evaporation chamber, and the fine metal particles are sprayed on the substrate by the pressure difference to form the metal column. Therefore, a wiring layer, a connection electrode for connecting the wiring layer to another wiring layer, and the like can easily be formed by a small number of steps.

6 Claims, 14 Drawing Sheets

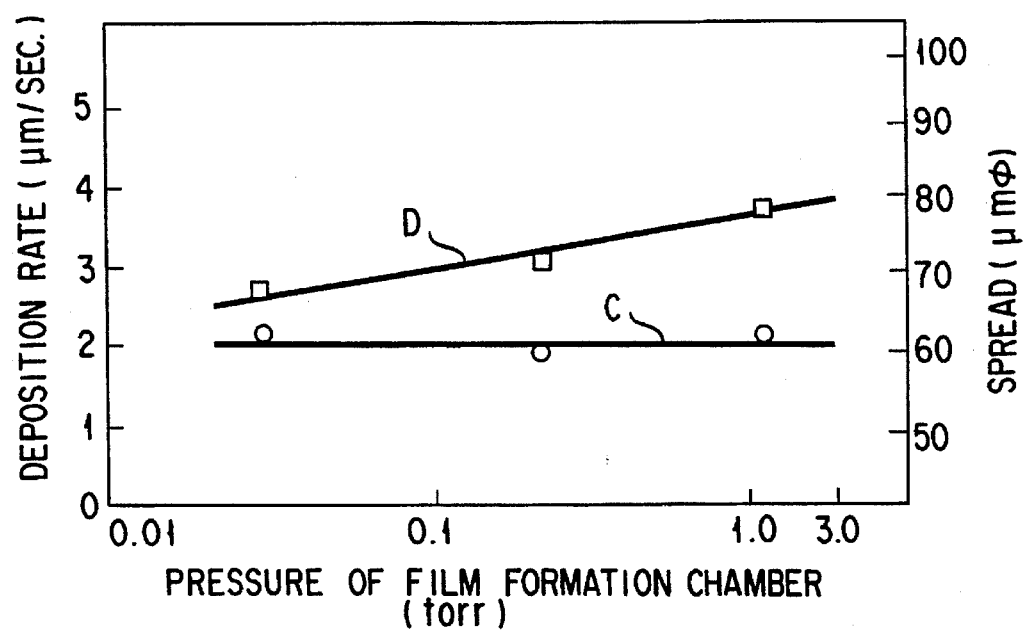
F I G. 4

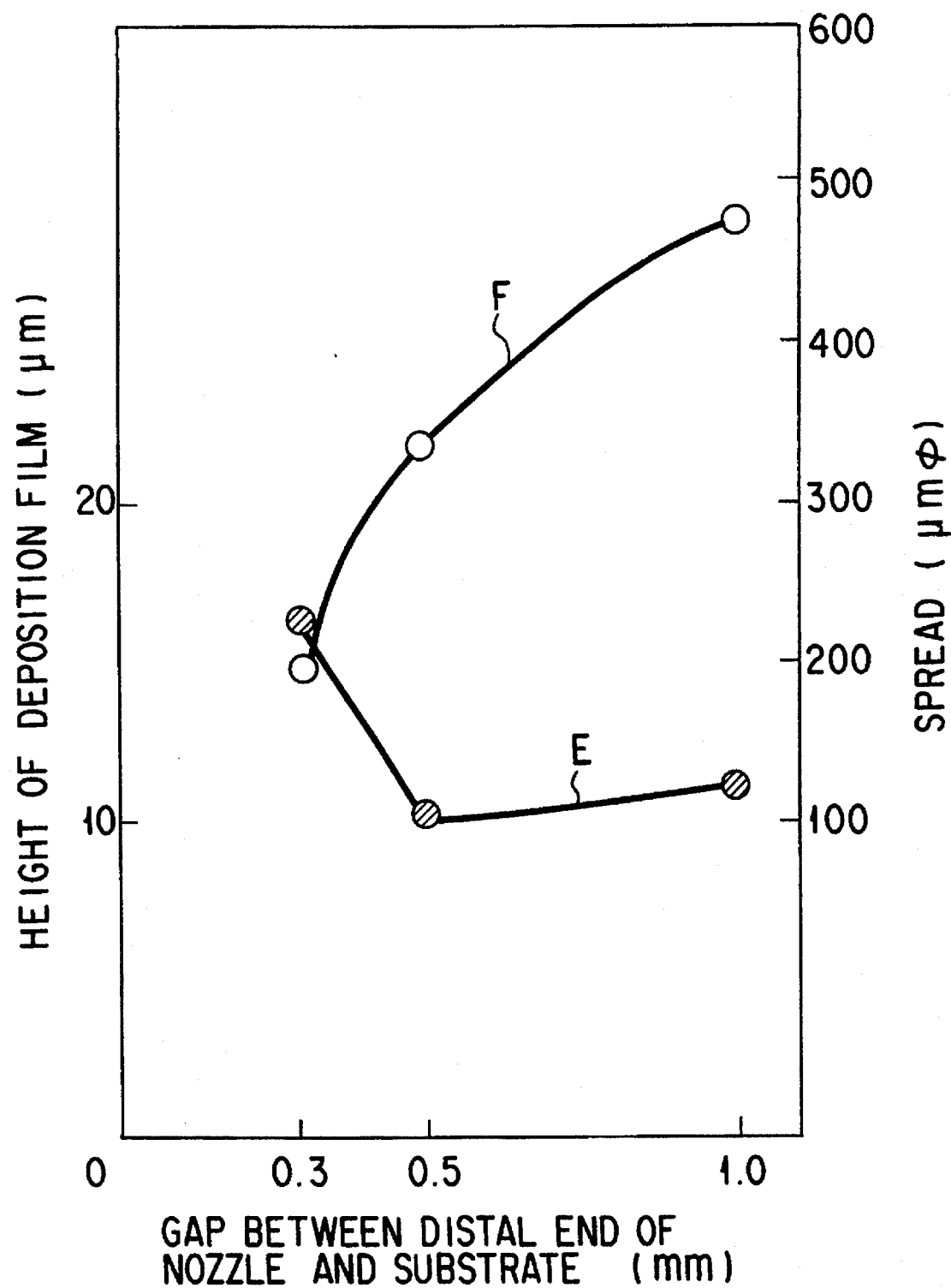
F I G. 5

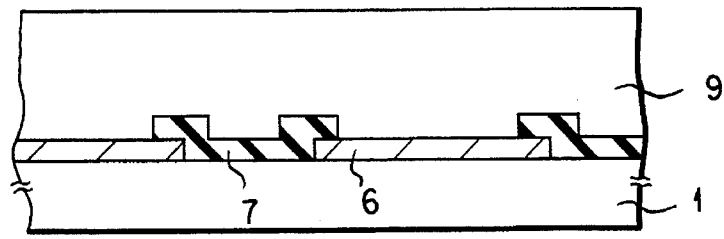
F I G. 8A
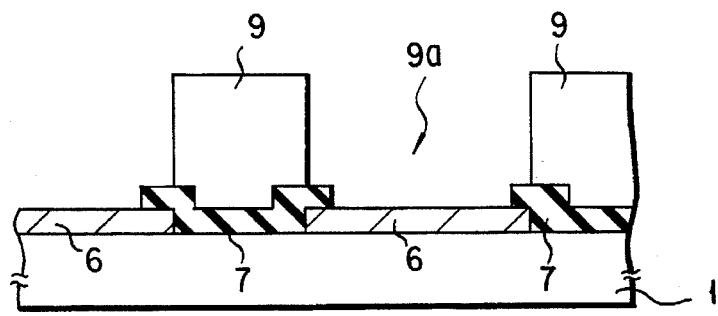
F I G. 8B
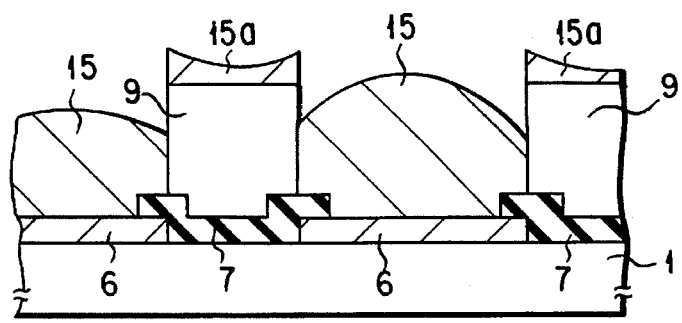
F I G. 8C
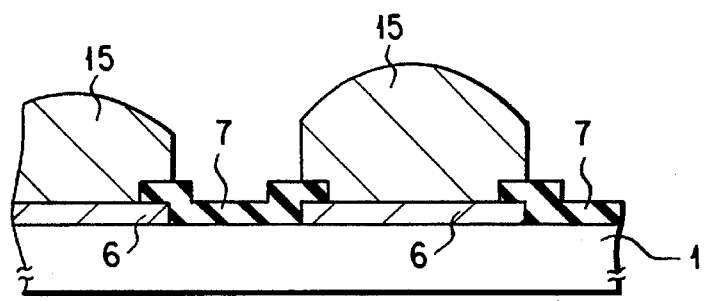
F I G. 8D

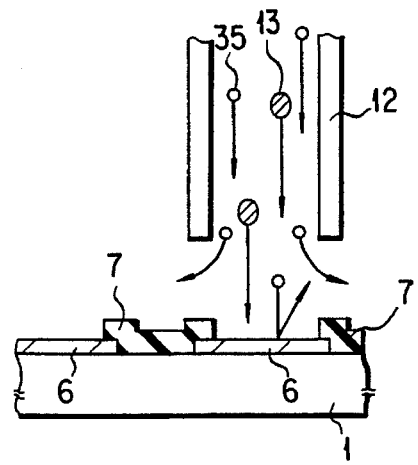
F I G. 9A
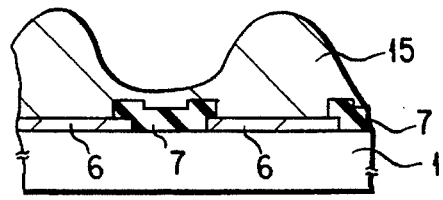
F I G. 9B
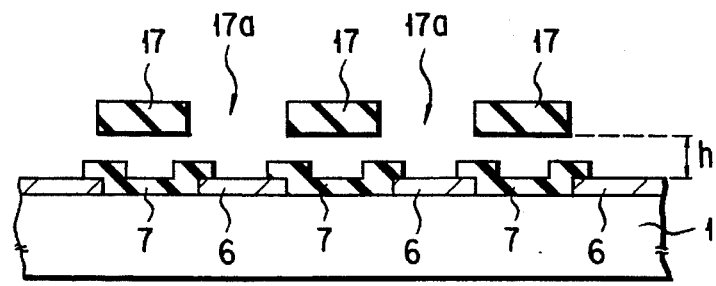
F I G. 10A
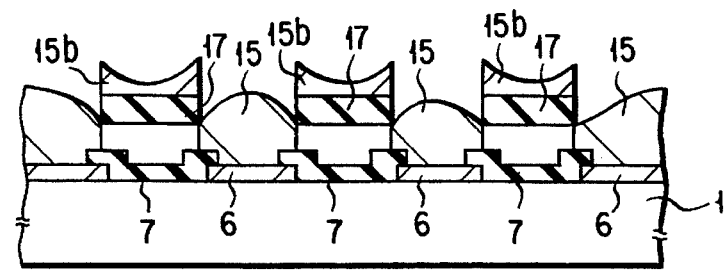
F I G. 10B

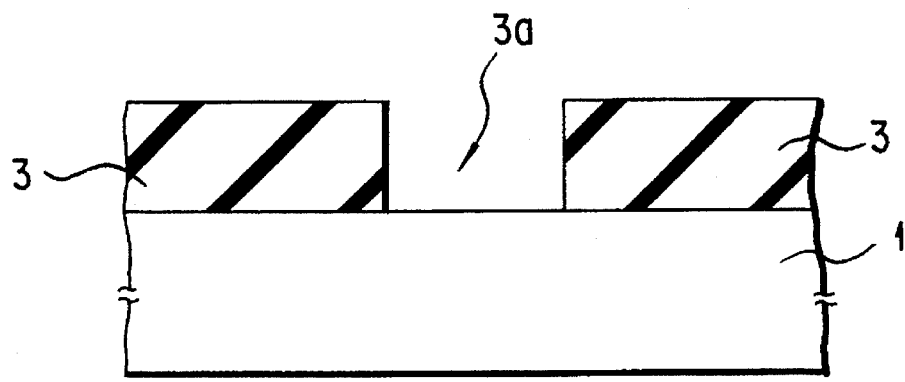
F I G. 11A
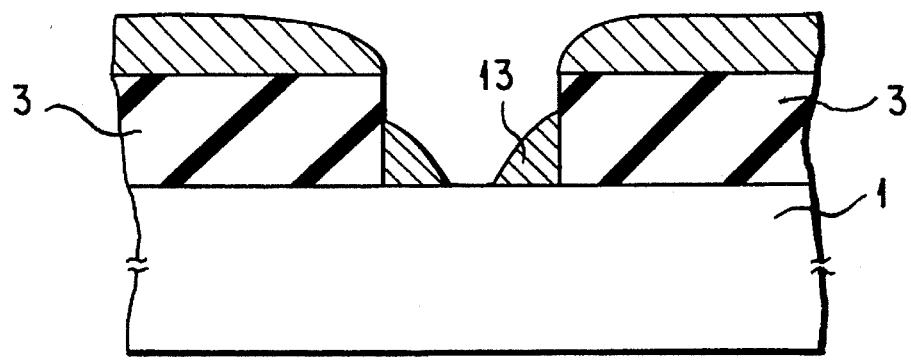
F I G. 11B
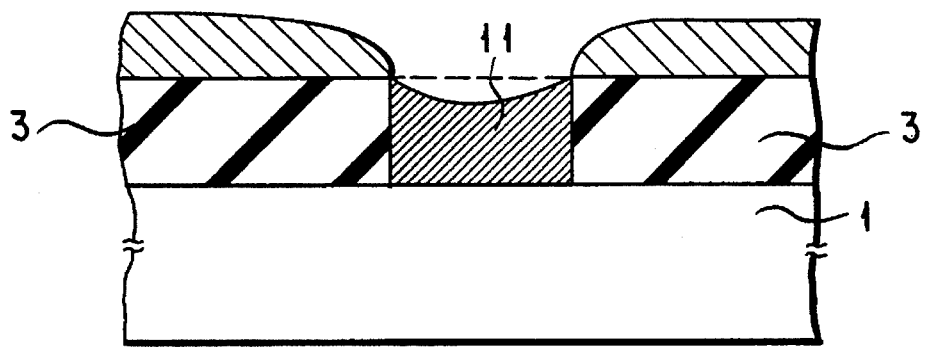
F I G. 11C

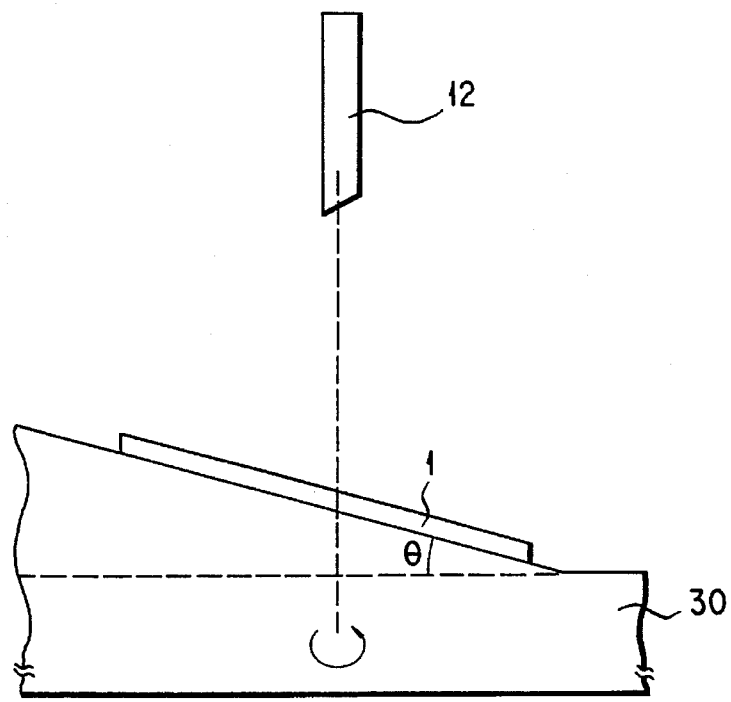
F I G. 12
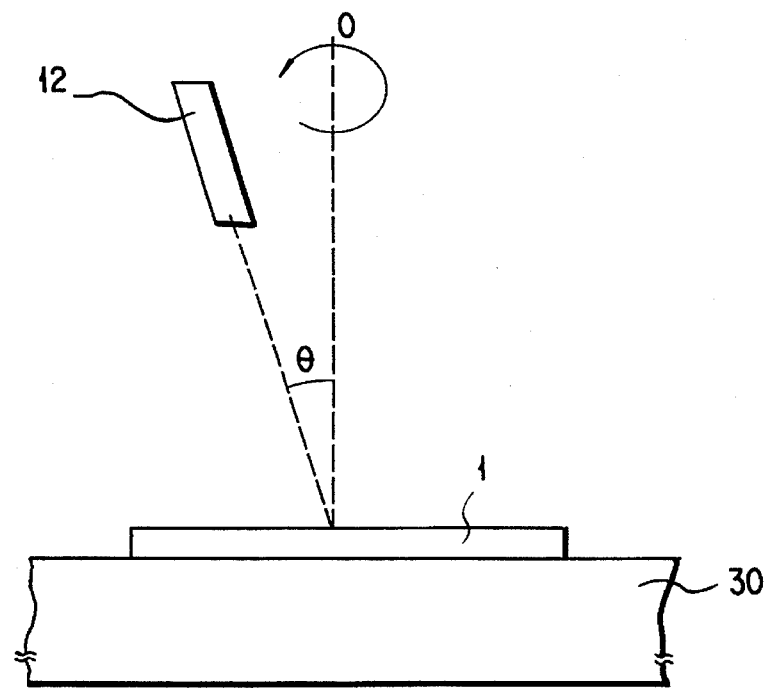
F I G. 13

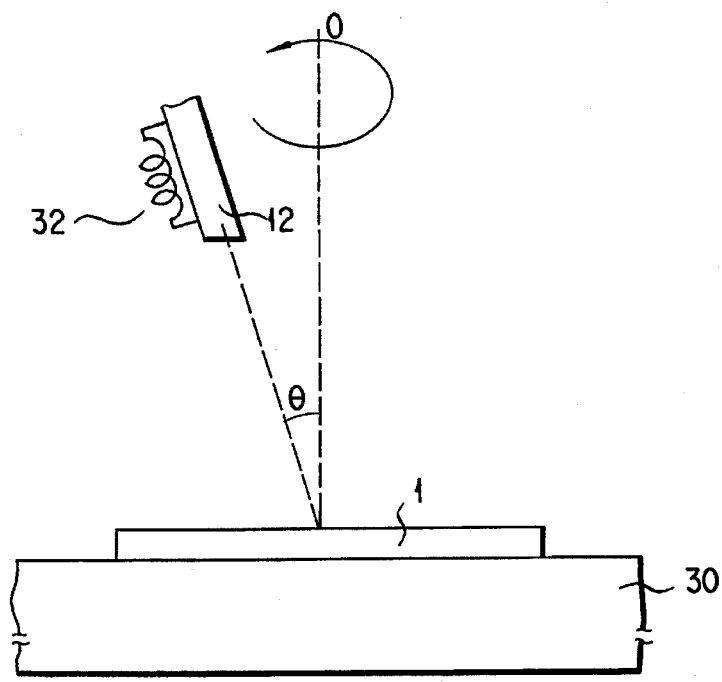
F I G. 14
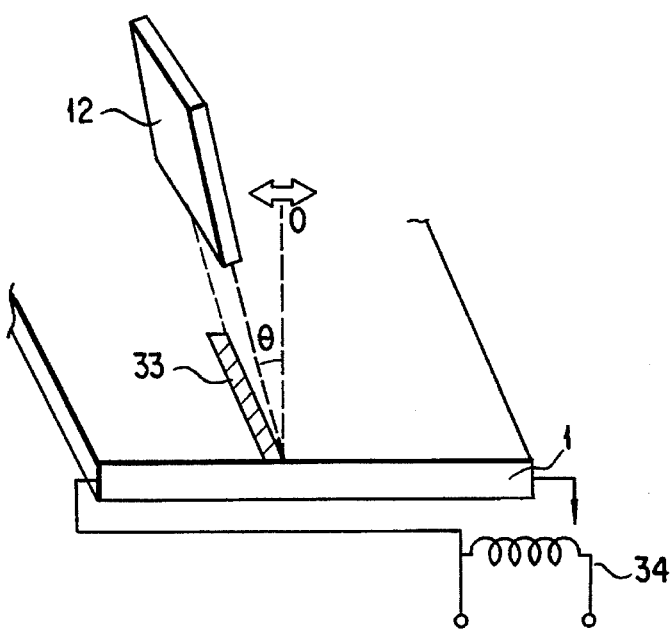
F I G. 15

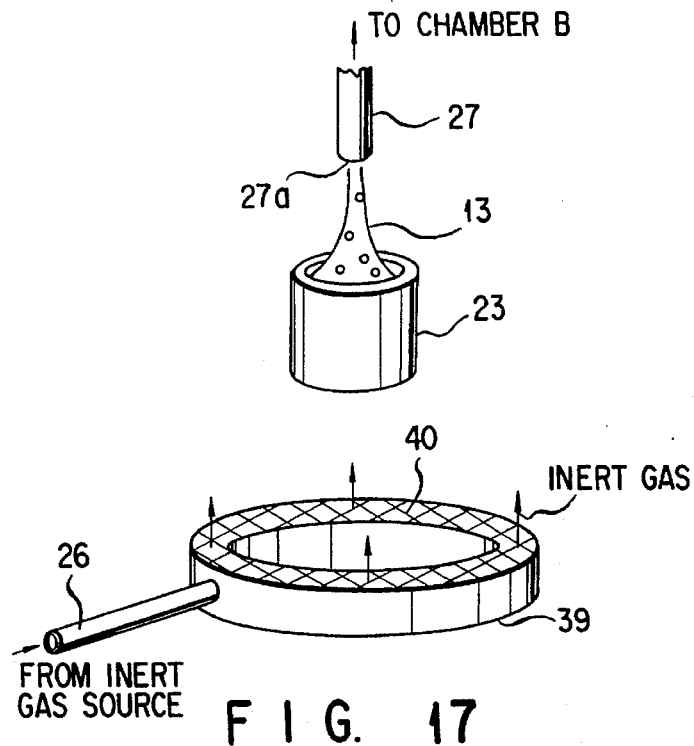
F I G. 17
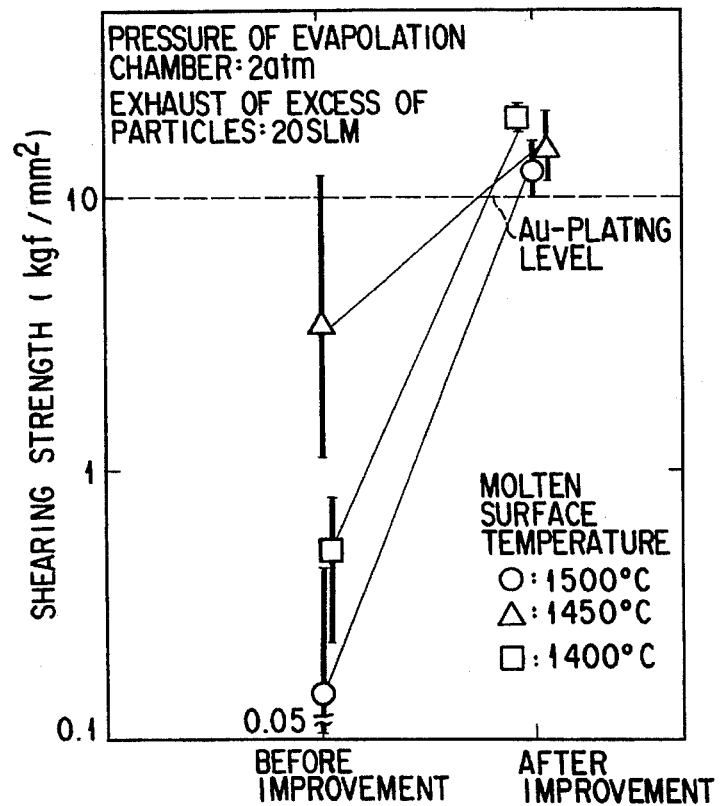
F I G. 19

APPARATUS AND METHOD OF MANUFACTURING SEMICONDUCTOR DEVICE

This is a division of application Ser. No. 08/172,940, filed Dec. 27, 1993 now pending.

BACKGROUND OF THE INVENTION

1. Field of the Invention

The present invention relates to a method of manufacturing a semiconductor device, such as a method of forming a conductive film such as a wiring layer, a method of connecting wiring layers to each other, and a method of connecting leads to an element region formed on a semiconductor substrate.

2. Description of the Related Art

Forming a wiring layer on a semiconductor substrate, connecting wiring layers to each other on a semiconductor substrate, connecting an element region of a semiconductor substrate to another circuit, or connecting multilayered wirings to each other on a circuit substrate on which a plurality of semiconductor chips and the like are mounted is one of important steps in manufacturing a semiconductor device. More specifically, when a compact semiconductor device having a high integration density is developed, multilayered wirings must be formed on a circuit substrate, and the multilayered wirings must be efficiently connected to each other to form a highly accurate semiconductor substrate.

A conventional method of connecting multilayered wirings to each other on a circuit substrate on which a plurality of semiconductor chips are mounted will be described below with reference to FIG. 1. For example, a first wiring layer 2 having a desired pattern is formed on a silicon semiconductor substrate 1. The first wiring layer 2 has a Ti/Cu/Ti multilayered structure consisting of two Ti layers each having a thickness of about 600 Å and a Cu layer having a thickness of about 3 μm and interposed between the two Ti layers. The first wiring layer 2 is formed by vacuum deposition or sputtering. Subsequently, for example, a polyimide solution is coated on the entire surface of the semiconductor substrate 1 and dried to form a polyimide insulating film 3. A contact hole 31 is formed in the polyimide insulating interlayer 3 by using a photolithographic technique, and the polyimide insulating interlayer 3 serving as an insulating interlayer is sintered. A second wiring layer 4 consisting of Ti/Cu/Ti or Al is formed by the same steps as those of the first wiring layer. At this time, the second wiring layer 4 is also formed in the contact hole 31 so as to electrically connect the first wiring layer to the second wiring layer. The above steps are repeated to connect other multilayered wiring layers to each other. Note that reference numeral 5 denotes an insulating film.

FIGS. 2A to 2E are sectional views showing the steps in manufacturing a conventional bump electrode. In order to connect an external circuit to an integrated circuit formed in an element region of the semiconductor substrate 1, a connection pad electrode 6 formed in a non-element region of the peripheral portion of the semiconductor substrate and electrically connected to the integrated circuit is formed. A bump (projection) electrode 10 may be formed on the pad electrode 6 to connect the pad electrode to a lead connected to the external circuit. The bump electrode 10 has been conventionally formed by gold-electroplating. More specifically, as shown in FIG. 2A, a plurality of Al pad electrodes 6 are formed by sputtering in the non-element region of the peripheral portion of the silicon semiconductor substrate 1. Each of the pad electrodes 6 is electrically connected to a semiconductor element such as an integrated circuit formed on the semiconductor substrate 1. An insulating protective film 7 consisting of $SiO_2$ is formed on the entire surface of the semiconductor substrate 1. Openings 7a are formed in regions of the insulating protective film 7 corresponding to positions at which the pad electrodes 6 are formed. As shown in FIG. 2B, one or more conductive films 8 required for electroplating are deposited on the entire surface of the resultant structure to cover the exposed pads 6 and the protective film 7. As shown in FIG. 2C, a photoresist 9 having a thickness of about 20 μm is coated on the semiconductor substrate 1, and the photoresist 9 is exposed and developed to form openings 9a in the photoresist 9 above only the pad electrodes 6 on which the bump electrodes 10 are to be formed. As shown in FIG. 2D, the conductive film 8 is rendered conductive by conductive pins or the like to perform electroplating, thereby forming the gold bump electrodes 10 in the openings 9a. In this case, a region, such as the lower surface of the semiconductor substrate 1, which should not be gold-plated is covered with an insulator in advance. As shown in FIG. 2E, the unnecessary photoresist 9 is peeled, and the conductive film 8 except for the conductive film under the bump electrodes 10 is removed using the gold bump electrodes 10 as masks. The bump electrodes 10 are insulated from each other.

As described above, conventional wiring processing requires a photolithographic technique, an etching technique such as RIE, a step such as the step of removing a photoresist. Similarly, a complicate step is required when openings of an insulating interlayer required for electrically connecting upper and lower wiring layers to each other are formed. In addition, when a bump electrode is to be formed by electroplating, the step of forming a film by sputtering, the lithographic step of forming a plating mask using a photoresist, the electroplating step of forming a bump electrode, and the like are required such that the complicate steps must be performed. Therefore, these steps are added to the final steps of a wafer process, a production yield may be decreased, and reliability may be degraded.

In order to form fine metal particles by a material to be melted, an inert gas must be fed into an evaporation chamber in which a crucible is arranged, and the evaporated material must be cooled. At this time, when the flow velocity of the fed inert gas is high, a stream, i.e., smoke of fine particles which rises upwardly from the crucible is fluctuated. Fine particles cooled by the inert gas are moved upwardly by heat convection. The above fluctuation of the stream of fine particles occurs because the flow velocity of the inert gas is higher than that of the stream of fine particles moved upwardly by the heat convection. Once the fluctuation occurs, fine particles which do not enter the suction port of a feed pipe remain in the evaporation chamber. Such fine particles are coagulated with fine particles which are newly produced in the evaporation chamber, thereby producing large size fine particles. A fine particle film is formed to contain the large size fine particles, and the adhesion strength between the fine particle film and a substrate is considerably degraded.

SUMMARY OF THE INVENTION

The present invention has made in consideration of the above circumstances, and has as an object to provide a method of manufacturing a semiconductor device which can easily be manufactured and in which a connection electrode for connecting wiring layers to each other or connecting a wiring layer to another conductor can be formed by a small number of steps.

The present invention has as another object to provide a metal film forming apparatus and method used for the same in which the flow velocity of the inert gas to be fed is controlled to regulate the flow of the inert gas in the evaporation chamber in which a crucible is arranged so as to suppress coarsening of the fine particles, thereby preventing large size fine particles from being mixed in the fine particle film since the flow velocity of the inert gas is reduced to be smaller than the flow velocity caused by heat convection in the evaporation chamber.

According to the present invention, a conductive material of fine particles is introduced, by a pressure difference between an evaporation chamber and a film formation chamber, to a substrate such as a semiconductor substrate and a circuit substrate placed in the film formation chamber whose pressure is lower than that the evaporation chamber in which the particles of the conductive material are formed, such that a conductive film used as a connection electrode for connecting wiring layers or connecting a wiring layer to another conductor is formed.

According to the first aspect of the present invention, there is provided a method of manufacturing a semiconductor substrate, comprising the steps of heating a metal source to evaporate a metal in the metal source, bringing evaporated metal into contact with an inert gas to obtain fine metal particles, feeding the fine metal particles onto a substrate by the inert gas, and spraying the fine metal particles so as to selectively form a metal film on the substrate. The substrate is a semiconductor substrate or a circuit substrate.

According to the second aspect of the present invention, there is provided a method of manufacturing a semiconductor device, comprising the steps of forming a first wiring layer on a semiconductor or circuit substrate, heating a metal source to evaporate the metal source, bringing the evaporated metal source into contact with an inert gas to obtain fine metal particles, feeding the fine metal particles onto the substrate by the inert gas and spraying the fine metal particles on the first wiring layer so as to selectively form a metal column, forming an insulating interlayer on the substrate to bury the metal column, etching the insulating interlayer to expose a distal end portion of the metal column, and forming a second wiring layer on the insulating interlayer.

According to the third aspect of the present invention, there is provided a method of manufacturing a semiconductor device, comprising the steps of heating a metal source to evaporate the metal source, bringing the evaporated metal source into contact with an inert gas to obtain fine metal particles, feeding the fine metal particles onto a substrate by the inert gas and spraying the fine metal particles on an electrode pad electrically connected to an internal circuit on the substrate so as to form a bump electrode. When the fine metal particles are to be sprayed on the substrate, a shielding plate in which an opening is formed at a portion corresponding to the electrode pad is provided above the semiconductor substrate.

According to the fourth aspect of the present invention, there is provided a method of manufacturing a semiconductor device, comprising the steps of forming an insulating film on a semiconductor or circuit substrate, forming a recessed portion having a predetermined shape in the insulating film, heating a metal source to evaporate the metal source, bringing the metal source into contact with an inert gas to obtain fine metal particles, feeding the fine metal particles onto the substrate by the inert gas and spraying the fine metal particles on the semiconductor or circuit substrate through a nozzle so as to selectively form a metal film in the recessed portion.

According to the fifth aspect of the present invention, there is provided a method of manufacturing a semiconductor device, comprising the steps of forming an insulating film on a semiconductor or circuit substrate, forming a recessed portion having a predetermined shape in the insulating film, heating a metal source to evaporate the metal source, bringing the evaporated metal source into contact with an inert gas to obtain fine metal particles, feeding the fine metal particles onto the semiconductor or circuit substrate by the inert gas and spraying the fine metal particles on an entire surface of the substrate including the recessed portion through a nozzle, and polishing the fine metal particles deposited on the entire surface of the substrate to remove the fine metal particles except for the fine metal particles in the recessed portion, thereby forming a metal film in only the recessed portion. The nozzle is inclined by a predetermined angle with respect to a vertical direction of the substrate arranged to oppose the nozzle.

According to the sixth aspect of the present invention, there is provided a metal film forming apparatus comprising a first vacuum chamber in which a crucible for heating and evaporating a material to be melted is arranged; means for supplying an inert gas into the first vacuum chamber; a second vacuum chamber in which a target substrate is arranged; means for feeding the inert gas from the first chamber to the second vacuum chamber; and means, arranged in the first chamber, for regulating a flow of the inert gas in the first chamber such that a normal erected on a central point of a surface of a molten material in the crucible is defined as an axis of symmetry of the flow of the inert gas when the material to be melted is heated and melted by the crucible.

According to the seventh aspect of the present invention, there is provided a method of forming a metal film, comprising the steps of supplying an inert gas into a vacuum chamber; heating a metal source in the vaccum chamber to evaporate a metal in the metal source; regulating a flow of the inert gas along a stream of evaporated metal in the vacuum chamber; bringing the evaporated metal into contact with the inert gas to obtain fine metal particles; feeding the fine metal particles onto a substrate by the inert gas; and spraying the fine metal particles so as to selectively form a metal deposit on the substrate.

A wiring layer and a connection electrode are easily formed by directly landing fine particles of a conductive material on a substrate such as a semiconductor substrate or a circuit substrate. For this reason, the number of steps of forming the wiring layer and connection electrode is smaller than that of the conventional technique, and step coverage is improved compared with that of the conventional technique. In addition, when the incident angle of the particles on a substrate is changed, the particles can be accurately deposited in a predetermined region. In addition, the flow velocity of the fed inert gas is decreased by the filter to regulate the flow of the inert gas in the evaporation chamber in which a crucible is arranged, so that coarsening of fine particles can be suppressed. Therefore, the fine particle film which contains no large size fine particle can be deposited on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention.

FIG. 4 is a graph showing dependencies of the deposition rate and spread of fine metal particles on a pressure of a film formation chamber according to the present invention;

FIG. 5 is a graph showing dependencies of the deposition height and spread of fine metal particles on a gap between the distal end of a nozzle and a substrate according to the present invention;

FIGS. 8A to 8D are sectional views for explaining the steps in manufacturing a semiconductor device in a method according to the second embodiment of the present invention;

FIGS. 9A and 9B are sectional views showing a substrate and a nozzle used in the method of manufacturing a semiconductor device according to the present invention;

FIGS. 10A and 10B are sectional views for explaining the steps in manufacturing a semiconductor device in a method according to the third embodiment of the present invention;

FIGS. 11A to 11C are sectional views for explaining the steps in manufacturing a semiconductor device in a method according to the fourth embodiment of the present invention;

FIG. 12 is a sectional view for explaining the fourth embodiment of the present invention;

FIG. 13 is a sectional view for explaining the fourth embodiment of the present invention;

FIG. 14 is a sectional view for explaining the fourth embodiment of the present invention;

FIG. 15 is a sectional view for explaining the fourth embodiment of the present invention;

FIG. 17 is a view schematically showing a thin film forming apparatus according to the fifth embodiment of the present invention;

FIG. 19 is a graph for explaining an advantage obtained by the fifth embodiment of the present invention.

DETAILED DESCRIPTION OF THE PREFERRED EMBODIMENTS

Methods of manufacturing semiconductor devices according to the present invention will be described below with reference to the accompanying drawings.

Figure 1:
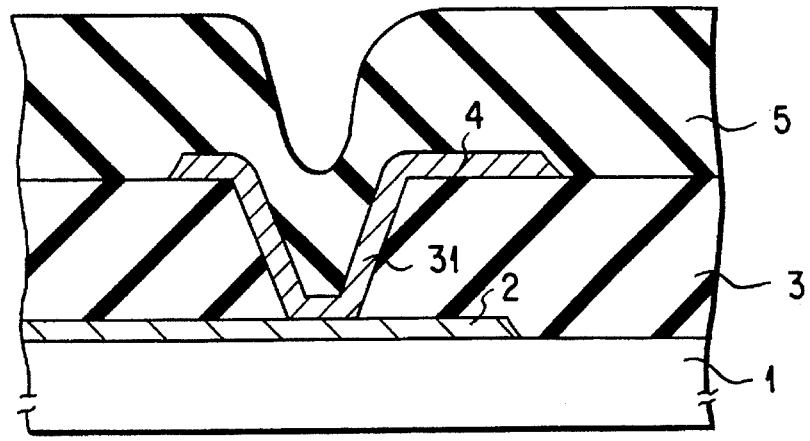
FIG. 1 is a sectional view illustrating connection between multilayered wirings on a conventional semiconductor substrate.
Figure 2A:
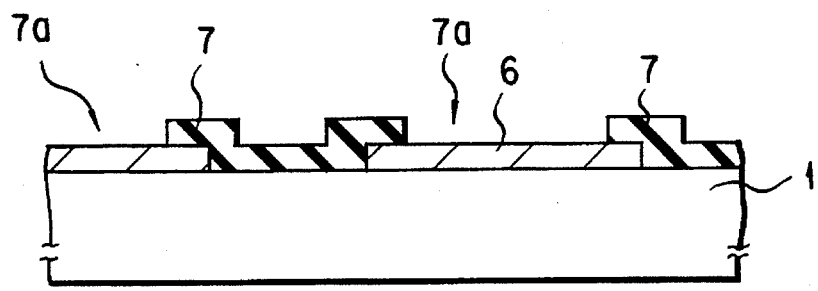
FIGS. 2A to 2E are sectional views for explaining the steps in manufacturing a conventional semiconductor device.
Figure 2B:
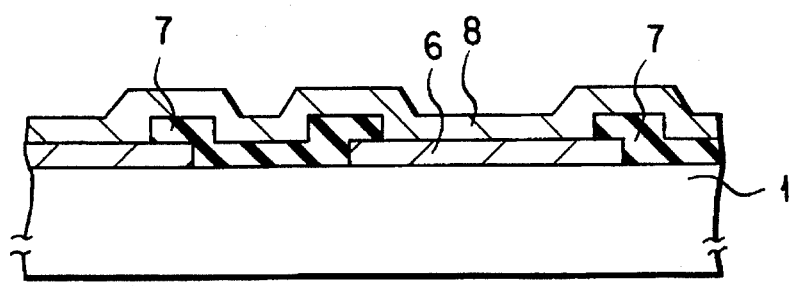
Figure 2C:
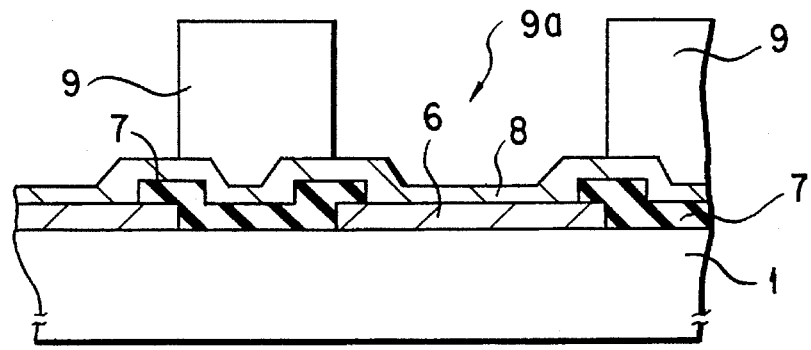
Figure 2D:
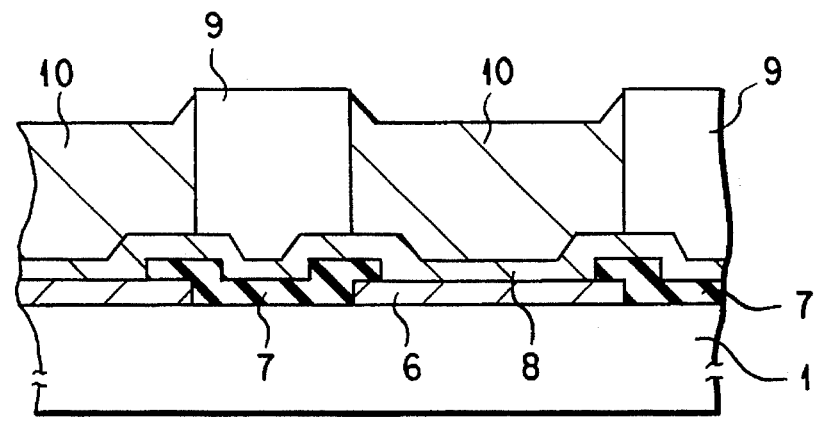
Figure 2E:
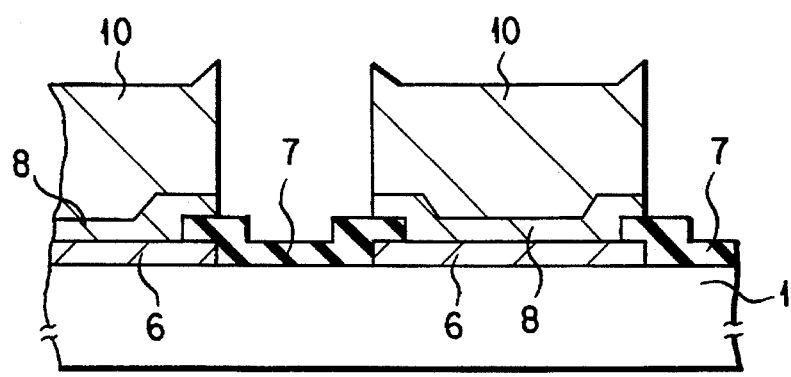
Figure 3:
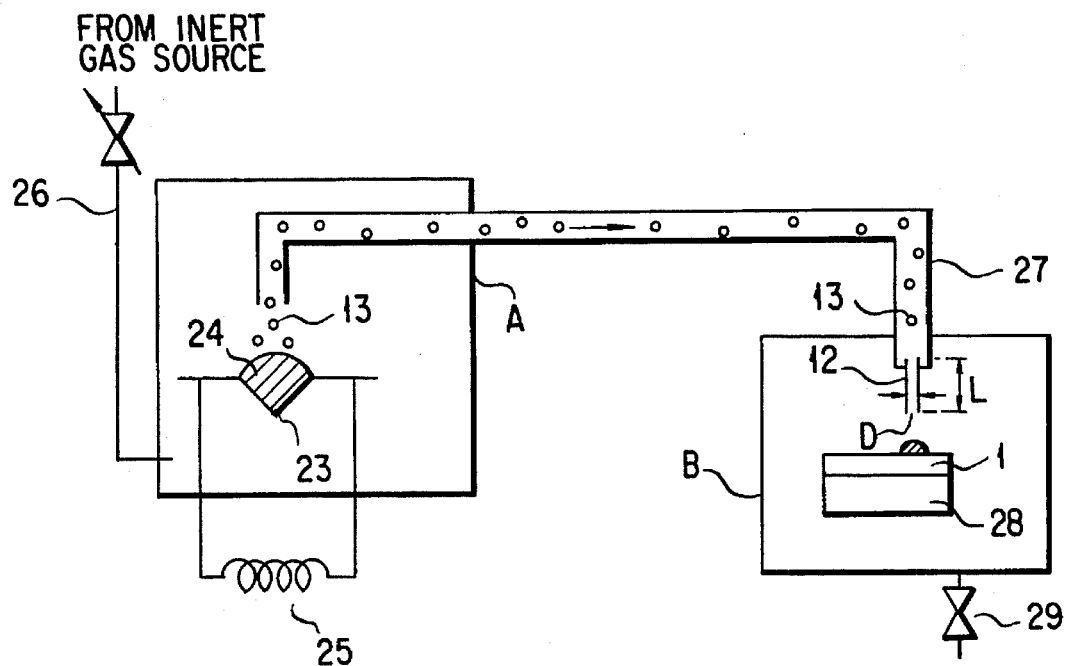
FIG. 3 is a schematic sectional view showing a semiconductor manufacturing apparatus used in the present invention.

FIG. 3 is a block diagram showing a semiconductor manufacturing apparatus for forming a conductive film by a gas deposition method used in the present invention. According to the gas deposition method, an evaporation chamber A for forming fine metal particles is separated from a film formation chamber B in which a substrate to be deposited with a metal film such as a metal column while depositing the metal film is placed, and the pressure of the film formation chamber B in which the substrate is placed is set to be lower than the pressure of the evaporation chamber A for forming fine metal particles. In this state, the fine metal particles are sprayed on the substrate by the difference in pressure to form a metal deposition on the substrate. A crucible 23 is arranged in an evaporation chamber A, and a metal source 24 such as Au or Sn is placed in the crucible 23. The crucible 23 consisting of graphite or the like is heated by a dielectric heating unit having good controllability to evaporate the metal source 24, thereby producing fine metal particles each having a grain size of several 100 to several 1,000 Å. When Au is used as the metal source 24, the metal source 24 is heated to about 1,400° C. by the heating unit 25. When Sn is used as the metal source 24, the metal source 24 is heated to about 1,200° to 1,300° C. In addition to Au and Sn, Ag, Cu, W, Al, or the like is used as the metal source 24. The evaporation chamber A has a supply pipe 26 for supplying an inert gas such as He or Ar, and the inert gas is fed into the evaporation chamber A. The pressure of the evaporation chamber A is set to be about 100 torr to 5 atm, and preferably 1 to 2 atm. A feed pipe 27 for feeding fine metal particles to a film formation chamber B is provided to the upper portion of the evaporation chamber A. A small-diameter nozzle 12 for narrowly splaying the fine metal particles is arranged on the distal end of the feed pipe 27. The distal end the nozzle 12 is opposite to the surface of a substrate 1. The small-diameter nozzle 12 has a diameter D of about 50 to 100 μm, and the small-diameter nozzle 12 may have a length L of about 1 to 2 mm because D/L may be set to be 10 to 20 or more. The substrate 1 on which fine metal particles are to be deposited is placed in the film formation chamber B. The substrate 1 is heated by a heater 28 such as a heating resistor. A vacuum pump 29 is arranged on the lower portion of the film formation chamber B, can reduce the pressure of the film formation chamber B at to several torr, and can maintain the reduced pressure. As is known, if the pressure of the film formation chamber B is set to be high, a metal film crumbles, and preferable deposition cannot be obtained. Fine metal particles 13 are fed from the evaporation chamber A to the film formation chamber B through the feed pipe 27 by a pressure difference between the evaporation chamber A and the film formation chamber B of the manufacturing apparatus so as to be deposited on the substrate 1. The diameter of a region in which the fine metal particles 13 are in contact with the substrate 1 depends on the inner diameter of the small-diameter nozzle 12. For example, when the inner diameter of the nozzle 12 is 100 μm, the diameter of the region is about 80 μm, and when the inner diameter of the nozzle 12 is 50 μm, the diameter of the region is about 30 μm. The deposited fine metal particles 13 spread depending on conditions, and the deposition may not be suitable for increasing the integration density of a semiconductor device. The spread of the fine metal particles 13 is influenced by a traveling speed of the fine metal particles sprayed from the nozzle 12 and a distance between the substrate and the nozzle.

The spread of the edge of a metal film formed by the fine metal particles will be described below with reference to the graphs of FIGS. 4 to 6B. The following characteristics are analyzed by the present inventors in this technical field for the first time.

FIG. 4 is a graph showing the dependencies, on the pressure of the film formation chamber B, of a deposition rate of the fine metal particles 13 on the substrate 1 and the spread of the fine metal particles 13 deposited on the substrate 1. Referring to FIG. 4, the pressure (torr) of the film formation chamber B is plotted along the abscissa, and the film formation rate (μm/sec) of the fine metal particles and the diameter (μm) of the spread of the deposited fine metal particles, i.e., the diameter of a region in which the metal film is in contact with the substrate, are plotted along the ordinate. In this case, the inner diameter of the nozzle is 100 μm, the pressure of the evaporation chamber A is 2 atm, and an He gas is supplied to the evaporation chamber A at 1 torr.l/sec. As indicated by a deposition rate-pressure curve C, the deposition rate is rarely changed even when the pressure of the film formation chamber B is changed. The diameter of the spread is increased in proportion to an increase in pressure of the film formation chamber as indicated by a spread-pressure curve D. These results are obtained because of the following reason. That is, the deposition rate depending on the pressure difference is rarely influenced by a change in pressure of the film formation chamber B because the pressure of the evaporation chamber A is set to be 2 atm in spite of setting the pressure of the film formation chamber B at about 1 torr at most. On the other hand, as the pressure of the film formation chamber B is increased, the mean free path of the fine metal particles 13 is shortened. For this reason, the number of times of collisions between the remaining gas in the film formation chamber B and the fine metal particles spraying from the distal end of the nozzle 12 is increased to scatter the fine metal particles, thereby increasing the diameter of the spread. For example, assuming that a bump electrode is formed by fine metal particles on a 100-μm² electrode pad formed on the semiconductor substrate of the semiconductor device, the pressure of the film formation chamber may be set to be 3 torr or less according to the conditions in FIG. 4 although the diameter of the spread of the fine metal particles is preferably set to be about less 100 μm.

FIG. 5 is a graph showing dependencies, on a gap between the distal end of the nozzle and the substrate, of the height and the spread of the fine metal particles 13 deposited on the substrate 1. Referring to FIG. 5, a gap (mm) is plotted along the abscissa, and the height (μm) of the fine metal particles and the diameter (μm) of the spread of the deposited fine metal particles are plotted along the ordinate. In this case, a pressure difference between the evaporation chamber A and the film formation chamber B is about 2 atm, and a multi-nozzle assembly constituted by a plurality of nozzles is used as a nozzle. In an embodiment to be described later of the present invention, deposition is performed at a gap of about 1 mm or less. However, the diameter of the spread is decreased as the gap is decreased, as indicated by a spread-gap curve F. In addition, since the deposition height reaches its maximum at a gap of about 0.3 mm as indicated by a deposition height-gap curve E and a distance between the substrate 1 and the nozzle 12 is most properly set to be about 0.3 mm. When the curve F extends left, the diameter of the spread seems to be further decreased. In fact, however, when the value of the gap is set to be about less than about 0.1 mm, the fine metal particles 13 are scattered like a jet from a portion where the fine metal particles slightly spread due to a conductance, thereby increasing the distance of the spread. Therefore, it is not preferable that the gap is set to be about less than 0.3 mm.

Figure 6A:
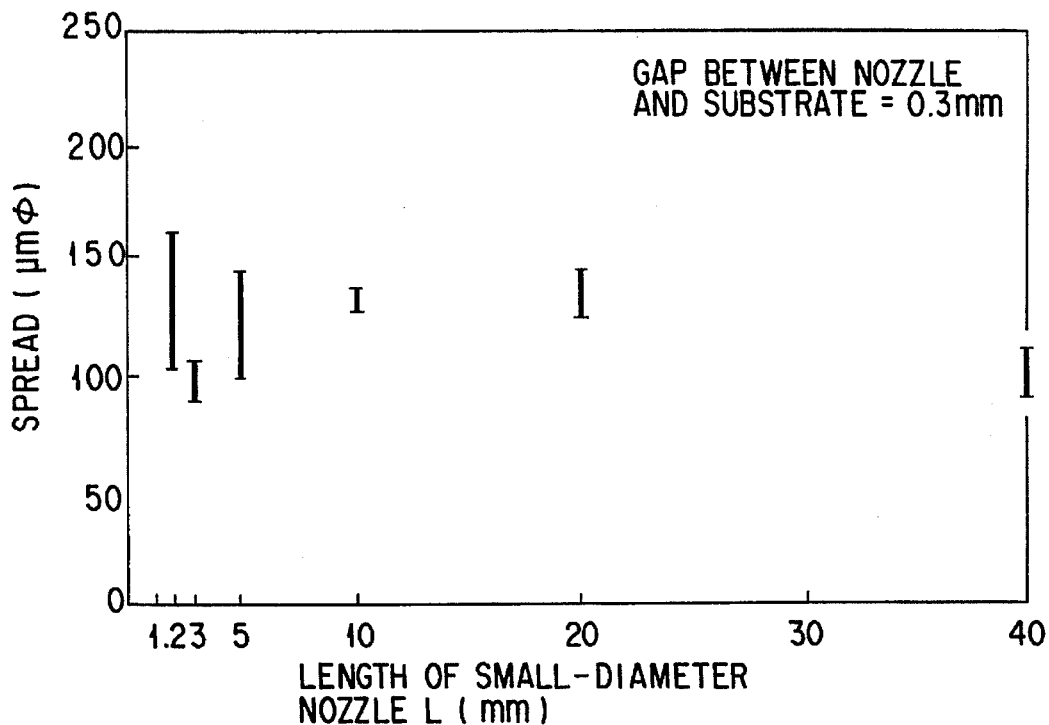
FIGS. 6A and 6B are graphs showing dependencies of the spread of fine metal particles on the length of the nozzle according to the present invention.
Figure 6B:
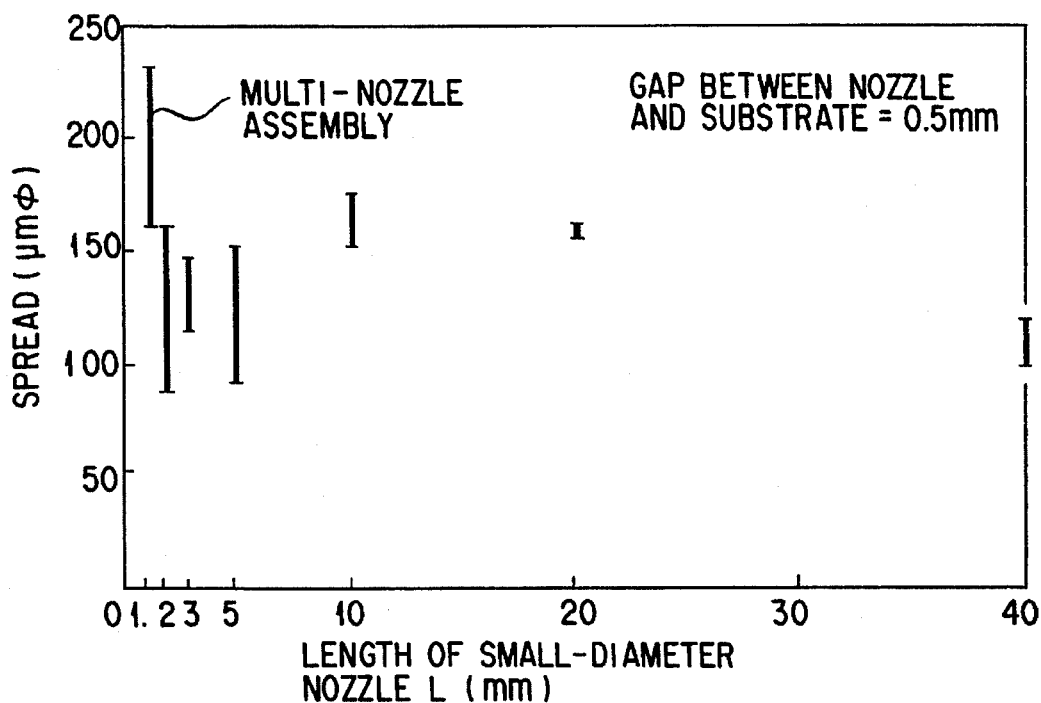

FIGS. 6A and 6B are graphs showing a dependency of the diameter D (μm) of the spread on the length of the small-diameter nozzle 12. Referring to FIGS. 6A and 6B, the length of the nozzle in FIG. 3 is plotted along the abscissa, and the diameter (μm) of the spread is plotted along the ordinate. When the fine metal particles spread on a region which is wider than the region in which the fine metal particles are sprayed, a semiconductor device having a high integration density is not obtained, and the steps of manufacturing the semiconductor device cannot be accurately controlled. For this reason, the diameter of the spread of the fine metal particles must be suppressed to about 100 to 150 μm. For this purpose, as shown in FIGS. 6A and 6B, the length L of the small-diameter nozzle is preferably set to be about 3 to 5 mm. In FIG. 6A, the inner diameter is set to be 0.1 mm, and the gap between the nozzle and the substrate is set to be 0.3 mm. In FIG. 6B, the inner diameter of the nozzle is set to be 0.1 mm, and the gap between the nozzle and the substrate is set to be 0.5 mm. As described above, according to the finding of the present inventors, it is apparent that the shape of the deposition film can be controlled by the inner diameter of the nozzle and various conditions of the gas deposition method.

Methods of manufacturing semiconductor devices by using the above gas deposition method according to embodiments of the present invention will be described below.

Figure 7A:
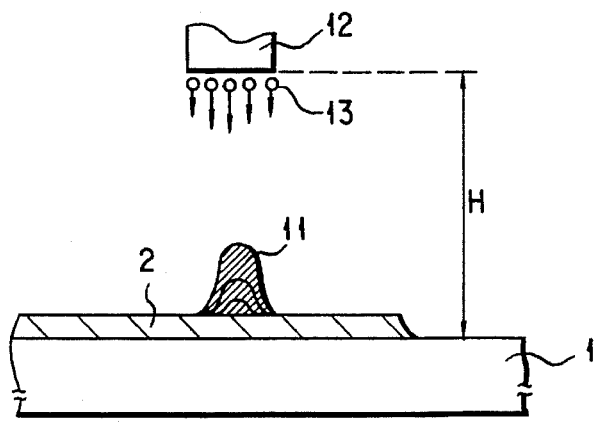
FIGS. 7A to 7D are sectional views for explaining the steps in manufacturing a semiconductor device in a method according to the first embodiment of the present invention.
Figure 7B:
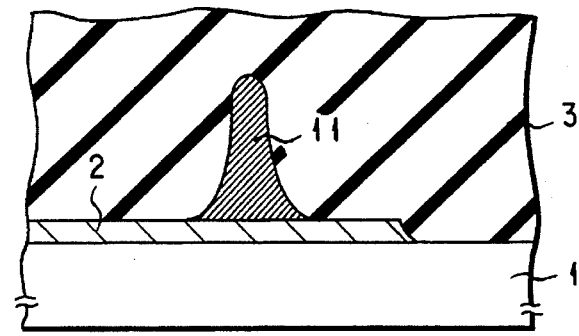
Figure 7C:
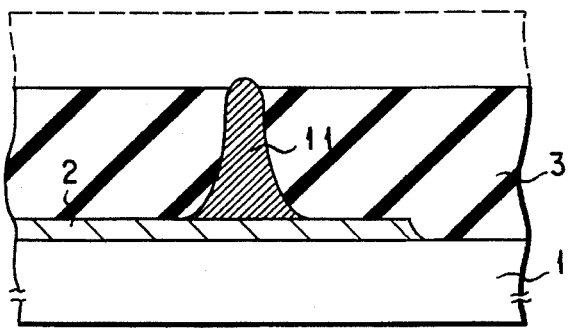
Figure 7D:
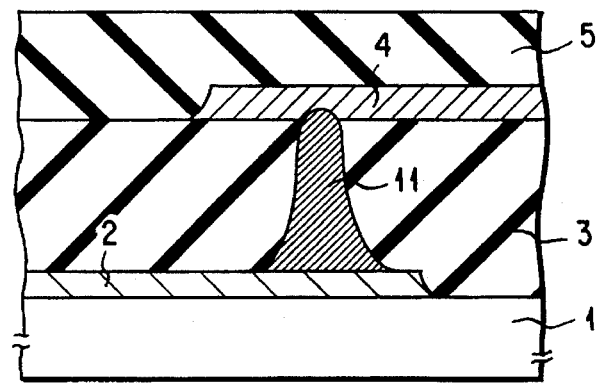

FIGS. 7A to 7D are sectional views for explaining the steps in manufacturing a semiconductor device in a method according to the first embodiment of the present invention. The semiconductor device in the first embodiment comprises a multi-tip structure in which a plurality of semiconductor chips are mounted on a circuit substrate having a multilayered wiring structure, and the multilayered wirings are connected to each other by a metal column 11. As shown in FIG. 7A, Ti or a barrier metal containing Ti, Cu, and Ni are continuously deposited to have thicknesses of about 1,000 Å, 3 μm, and about 3,000 Å, respectively, by a vacuum deposition or sputtering on a circuit substrate 1 consisting of AlN. The stacked Ni/Cu/Ti layers are etched using photolithography. For example, the Ni layer is etched by a solution mixture of HCl, HNO₃, and CH₃COOH, and Ti and Cu layers are etched by a solution mixture of H₂O₂ and the C₆H₈O₇, thereby forming a first metal wiring layer 2 having a predetermined pattern having a wiring width of 20 to 30 μm. The Au metal column 11 having a height of about 20 μm is deposited in a 30- to 50-μm² predetermined region on the first metal wiring layer 2. The deposited Au metal column 11 is obtained as follows. That is, fine Au particles 13 obtained by evaporating Au in an inert gas and each having an average grain size of about 500 Å are sprayed with an He gas from the distal end of a small-diameter nozzle 12 on a predetermined region to locally deposit the fine Au particles on the region. At this time, the temperature of the substrate is set to be about 200° C. or more, the adhesion property of the fine metal particles on the wiring layer surface is improved, and the wiring layer having a low contact resistance can be obtained. The diameter of the region in which the metal column 11 is in contact with the substrate depends on the inner diameter of the small-diameter nozzle 12. For example, when the inner diameter of the nozzle 12 is 100 μm, the diameter of the region is about 80 μm, and when the inner diameter is 50 μm, the diameter is about 30 μm. A distance between the distal end of the nozzle 12 and the surface of the AlN substrate 1 is about 1 mm or less. As shown in FIG. 7B, a polyimide solution having a viscosity of about 20,000 cp is dropped on the circuit substrate 1, spin rotation at 500 rpm for 10 sec and spin rotation at 1,500 rpm for 15 sec are sequentially performed. The polyimide solution is then dried and cured in an $N_2$ atmosphere at 150° C. for 60 minutes to obtain a polyimide film 3. As shown in FIG. 7C, the resultant structure is etched back by a choline solution to expose the distal end of the Au metal column 11, and the polyimide film is finally cured at 320° C. for 30 minutes to form a polyimide insulating interlayer 3 having a thickness of about 30 μm. As shown in FIG. 7D, a second wiring layer 4 consisting of an Ni/Cu/Ti multilayered structure is formed on the polyimide insulating interlayer 3. As shown in FIG. 7D, the metal column 11 is used to connect the first and second wiring layers to each other. The metal column is buried in the insulating interlayer 3 to electrically connect the two upper and lower wiring layers to each other. Another wiring layer is formed on the resultant structure through an insulating protective film or insulating interlayer 5. The metal column 11 consisting of fine Au particles has small crystal grain sizes and a high resistivity, i.e., about 5 μΩcm. Even when recrystallization and an increase in crystal grain size cannot be performed due to the limit of the heat resistance of the insulating interlayer 3 by high-temperature annealing after the multilayered wiring is formed, when the height of the metal column 11 and the diameter of a portion in which the metal column 11 is in contact with the substrate 1 are approximated to 20 μm and 30 μm, respectively, the resistance of the metal column 11 is 1.4 mΩ. For this reason, the resistance does not cause degradation of the characteristics of the semiconductor device. In addition, a contact resistance between the Au metal column 11 and the second wiring layer 4 is low because the surface of the metal column 11 is not oxidized. The step of forming an opening in the insulating interlayer 3 can be completely omitted because the polyimide film 3 is etched back to expose the distal end of the metal column 11 and to flatten the polyimide film 3. A screen printing method can be used to form the above wiring structure. When this method is also used, the steps can be simplified. However, a maximum sintering temperature of a metal paste used in the printing method is limited to the temperature of the heat resistance of the insulating interlayer 3 or less, thereby restricting the types of paste materials.

FIGS. 8A and 8D are sectional views for explaining the steps in manufacturing a semiconductor device in a method according to the second embodiment of the present invention. In the second embodiment, a bump electrode 15 formed on an electrode pad formed on the surface of a semiconductor substrate having an element region is formed. As shown in FIG. 8A, an electrode pad 6 is formed on a semiconductor substrate 1, and the semiconductor substrate 1 is covered with an insulating protective film 7. The pad electrode 6 is exposed from the insulating protective film 7. A photoresist 9 is coated on the semiconductor substrate 1 to have a thickness of about 20 μm. As shown in FIG. 8B, this polymer film is exposed and developed, and an opening 9a is formed at only a portion of the photoresist 9 corresponding to the electrode pad 6 on which the bump electrode 15 is to be formed. Although not shown, Au is heated in an evaporation chamber A in which the pressure of a He gas is set to be about 2 atm, thereby generating fine Au particles. The pressure of a film formation chamber B in which the substrate 1 is placed is set to be lower than that of the evaporation chamber A. The fine Au particles are fed with the He gas by using a pressure difference between the chambers A and B. As shown in FIG. 8C, the fine Au particles are sprayed, by using a small-diameter nozzle 12 used in FIG. 3, on the semiconductor substrate 1 in the film formation chamber B whose pressure is decreased to several torr or less. When the small-diameter nozzle 12 is aligned with the opening 9a when the fine Au particles are to be sprayed on the semiconductor substrate 1, and a gap between the semiconductor substrate 1 and the distal end of the small-diameter nozzle 12 is set to be about 1 mm, the fine particles are sprayed on the semiconductor substrate 1, such that an Au bump electrode 15 can be formed on the electrode pad 6 in the opening 9a. If, in FIG. 8C, the photoresist 9 is not formed, when the fine metal particles 13 are sprayed with an inert gas 35 from the small-diameter nozzle 12 on the electrode pad 6, as shown in FIG. 9A, the fine metal particles 13 spread with the inert gas 35. As a result, as shown in FIG. 9B, the edge of the bump electrode 15 spreads so as to be connected to other bump electrodes. As shown in FIG. 8D, when the photoresist 9 used as a mask is removed, a mass 15a of unnecessary fine Au particles deposited on the photoresist 9 is removed together with the photoresist 9. The independent bump electrode 15 is formed.

FIGS. 10A and 10B are sectional views for explaining the steps in manufacturing a semiconductor device in a method according to the third embodiment of the present invention. The third embodiment is a modification of the second embodiment. In the third embodiment, a shielding plate 17 is used in place of the formation of the photoresist 9. A conductive plate or an insulating plate may be used as the shielding plate 17. When fine metal particles are to be sprayed on a semiconductor substrate 1, as shown in FIG. 10A, the shielding plate 17 having openings 17a each having a predetermined shape are provided between the semiconductor substrate 1 and a nozzle. Each of the openings 17a is arranged to oppose a corresponding one of electrode pads 6. In this state, when the fine metal particles are sprayed on the semiconductor substrate 1, as shown in FIG. 10B, a bump electrode 15 is formed on the electrode pad 6. A mass 15b of unnecessary fine particles deposited on the shielding plate 17 is removed with the shielding plate 17 from the semiconductor substrate 1. A distance h between the shielding plate 17 and the semiconductor substrate 1 may be set to be about 1/10 or less of the distance H between the nozzle and the semiconductor substrate surface shown in FIG. 7A. Even when there is a small space between the shielding plate 17 and the semiconductor substrate 1, a deposition region of the fine metal particles rarely extend because the fine metal particles spraying from the nozzle have good directivity. However, when the distance h is excessively long, the shielding plate 17 cannot function as a mask. As a method of fixing the shielding plate 17 between the nozzle 12 and the substrate 1, a support member is arranged on the shielding plate 17 to be fixed to the semiconductor substrate 1. On the other hand, a method of fixing the shielding plate 17 to the nozzle 12 is also used. According to this method, positional alignment between the nozzle 12 and the opening 17a can be performed by one operation.

FIGS. 11A to 11C are sectional views for explaining the steps in manufacturing a semiconductor device in a method according to the fourth embodiment of the present invention. In the fourth embodiment, a method of burying fine connection holes and fine grooves by deposition of fine metal particles is disclosed. An He gas is supplied into an evaporation chamber A by a supply pipe 26 in FIG. 3, and the evaporation chamber A is set in an inert gas atmosphere having a pressure of about 1 atm. An induction heating unit 25 heats a crucible 23 to about 1,300° C. to evaporate Ag serving as a metal source 24. The evaporated Ag constitutes fine metal particles as a metal aggregate. On the other hand, a film formation chamber B in which a semiconductor substrate 1 is placed is set in a low-pressure state of about 1 torr. The fine Ag particles are fed into the film formation chamber B through a feed pipe 27 by using a pressure difference between the evaporation chamber A and the film formation chamber B. As shown in FIG. 11A, an insulating film 3 is formed on the semiconductor substrate 1, and a contact hole 3a is formed in the insulating film 3. As shown in FIG. 11B, the fine metal particles 13 are directly sprayed in the contact hole 3a formed in the insulating film 3 on the semiconductor substrate 1 to be deposited in the contact hole 3. As shown in FIG. 11C, the flow of the fine metal particles is uniformed with the flow of the He gas, and the deposition of the particles begins from the bottom portion of each pore because the particles having a mass larger than that of the He gas can travel straight.

FIGS. 12 to 14 are sectional views for explaining spray angles of a nozzle 12 with respect to the semiconductor substrate 1. FIG. 12 shows a case wherein the surface of a table 30 on which the substrate 1 is placed is inclined with respect to the horizontal direction in the chamber B. The fine metal particles are sprayed while the substrate 1 and the table 30 are rotated about the nozzle 12 and a line extending vertically from the nozzle. FIG. 13 shows a case wherein the nozzle 12 is inclined by an angle i with respect to the normal direction of the horizontally placed substrate 1. A normal line O extending upward from a spray point of the fine metal particles sprayed on the substrate 1 is used as an axis, and the nozzle is rotated while keeping the angle i between the nozzle 12 and the axis. In this state, the fine metal particles are sprayed while the nozzle is rotated. In this manner, when the spray angle of the particles which can travel straight is controlled, the sprayed fine metal particles can also be deposited on the side wall of the contact hole 3a. Note that, as shown in FIG. 14, a heating unit 32 such as an electric resistor can be provided to the nozzle 12 or the feed pipe 27. As described above, when the nozzle or the feed pipe is heated, the fine metal particles are heated, and the adhesion property of the fine metal particles to the substrate 1 is improved.

FIG. 15 is a perspective view for explaining a slit-like nozzle. Fine metal particles are sprayed on the entire surface of a substrate 1 including a groove formed in the substrate 1 while the nozzle 12 scans in the directions of the arrow in FIG. 15, and the resultant deposition film is polished. The deposited film is removed except for the film deposited in the groove portion, thereby forming the deposition film in only the groove and the contact hole. In this manner, a wiring pattern 33 can easily be formed. At this time, if a heating unit 34 is provided to the substrate 1 to heat the substrate 1, the adhesion property of the fine metal particles is further improved. As described above, when fine metal particles are used for forming a metal film for a semiconductor device, a metal column used for forming a wiring pattern and connecting wiring layers to each other, a bump electrode serving as a signal input/output electrode of a semiconductor element, and the like can easily be formed.

Figure 16:
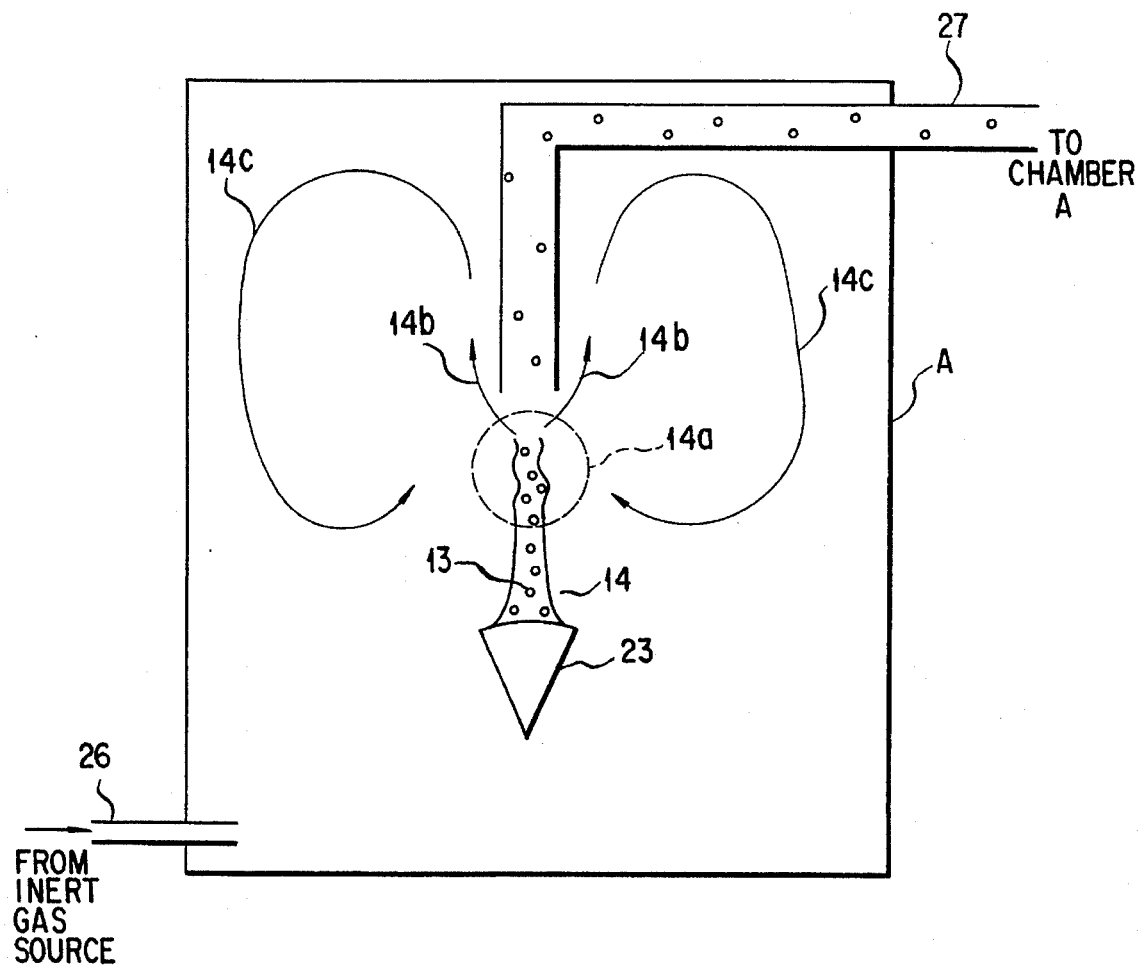
FIG. 16 is a view schematically illustrating the principle how large size particles are formed.

FIG. 16 is a view schematically illustrating the principle how large size particles are formed in the evaporation chamber A. The inert gas is supplied to the evaporation chamber A through the supply pipe 26 from the inert gas source (not shown). If the flow velocity of the inert gas is high, fluctuations of a stream 14, i.e., a smoke 14 of evaporated fine particles occur before the suction port 27a of the feed pipe 27, as shown by a dotted line 14a. Such fluctuation of the steam 14 occurs because the flow velocity of the inert gas is higher than that of the stream of fine particles moved upwardly by the heat convection. The fluctuation of the steam 14 occurs irrespective of the temperature of the crucible 23. As a result, the fine particles which are not sucked into the feed pipe 27 as shown by an arrows 14b are circulated by the heat convection in the evaporation chamber A, as shown by an arrows 14c, and contacted to newly evaporated fine particles to produce large size particles. These large size particles are also supplied to the film formation chamber B through the feed pipe 27 and are sprayed on the substrate.

FIG. 17 is a view showing a thin film forming apparatus according to the present invention. In this embodiment, as shown in FIG. 17, the supply pipe 26 is connected to a circular filter 39. The filter 39 having an outer diameter of 120 mm and an inner diameter of 60 mm is arranged below the crucible 23 at the central point of the crucible 23 arranged in the evaporation chamber A. The interior of the filter 39 is filled with stainless steel fibers 40, for example, the diameter of which is 100 μm. The fibers 40 are formed in a mesh form and provided in the filter 39 to reduce the flow velocity of the inert gas such as the He gas to a flow velocity which is equal to or is lower than that of the stream of fine particles moved upwardly by the heat convection. The degree of opening of the filter 39 is about 50%. That is, the fibers 40 occupies 50% of an opening area of the filter 39. An He gas is fed into the evaporation chamber A through the supply pipe 26. At this time, the flow velocity of the He gas is 5 m/sec at the outlet of the supply pipe 26 whereas the flow velocity of the He gas passing through the filter 39 is decreased to about 0.2 m/sec. In the case where the suction port 27a of the feed pipe 27 is located 50 mm above the crucible 23, under the above described fine-particle forming condition, a flow of the He gas flowing from the crucible 23 to the fine-particle suction port 27a of the feed pipe 27 is defined by heat convection and is about 1 m/sec. Since the flow velocity of the He gas is lower than the flow velocity of 1 m/sec, the stream of evaporated fine particles which rises upwardly from the crucible 23 is not disturbed by the flow of the He gas. In particular, the filter 39 is arranged in the evaporation chamber A such that a normal erected on a central point of the surface of the molten material in the crucible 23 is defined as an axis of symmetry of the flow of the inert gas when the metal to be melted is heated and melted by the crucible 23. Therefore, the flow of fine particles flowing toward the suction port 27a of the feed pipe 27 can be kept symmetric with respect to the center axis of the crucible 23.

Figure 18A:
FIG. 18A is a photograph showing the shape of a deposited film before a filter is arranged in FIG. 17.
Figure 18B:
FIG. 18B is a photograph showing the shape of a deposited film after the filter is arranged in FIG. 17.

FIG. 18A shows the shape of a fine particle film before the filter 39 is arranged at the distal end of the supply pipe 26 when the nozzle 12 having an inner diameter of 100 μm and a length of 30 mm is used. Before the filter 39 is arranged, the evaporation stream of fine particles in the evaporation chamber A is fluctuated, e.g., such fluctuation occurs once per second with a fluctuation width of 0.2 mm. Fine particles which are not directly sucked into the feed pipe 27 are subjected to heat convention in the evaporation chamber A so that such fine particles are combined with another fine particles so as to produce large size fine particles. The large size particles are also drawn into the feed pipe 27, and they are mixed with a deposited film made by the fine particles. Since the deposited film in which the large size fine particles are mixed is in contact with an underlying layer such as the semiconductor substrate with a very small contact area because of their large diameter, the adhesion strength between the fine particle film and the underlying layer is degraded. As a result, the adhesion strength is unstable and varies widely every deposited film. On the contrary, FIG. 18B shows the shape of the fine particle film after the filter 39 is arranged at the distal end of the supply pipe 26. After the filter 39 is arranged, the flow of the inert gas is regulated and the stream of fine particles evaporated from the crucible 23 is not fluctuated. A film in which large size fine particles are rarely mixed can be deposited on the underlying layer. As a result, a sufficient contact area can be assured between fine particles and the underlying layer so that a stable adhesion strength which is determined by the materials of fine particles and the underlying layer can be obtained between the deposited film and the underlying layer.

FIG. 19 shows a result of a shearing strength test of the fine particle film deposited before and after providing the filter 39 of the present invention is arranged. The samples of the fine particle columns, as shown in FIGS. 18A and 18B, of Au are formed before and after providing the filter 39 at 1400° C., 1450° C. and 1500° C. of the molten surface temperature in the crucible 23, respectively. Before providing the filter 39, the shearing strength of the fine particle columns are widely distributed in the range of 0.05 to 10.2 kgf/mm² in FIG. 19. An average shearing strength of the fine particle film deposited before the filter 39 is arranged is 1 kgf/mm². On the other hand, after providing the filter 39, the shearing strength of the fine particle columns of Au are collected in a small range shown in FIG. 19 irrespective of the molten surface temperature. An average shearing strength after the filter 39 is provided is greatly increased up to 10 kgf/mm². This average shearing strength is in excess of the shearing strength level obtained by the Au-plating process, which is shown by the dotted line in FIG. 19.

According to the above embodiments of the present invention, a metal film formed by depositing fine metal particles is mainly applied to a semiconductor substrate (semiconductor chip) on which a semiconductor element such as an integrated circuit is formed or to the circuit substrate of a multi-chip type semiconductor device having a circuit substrate on which a plurality of semiconductor chips are mounted. In addition, particles consisting of an insulating material other than a conductive metal are formed in an oxidizing gas atmosphere, the particles are sprayed by using the gas deposition method of the present invention so as to be able to bury the insulating particles. When an insulating material is placed in a crucible of an evaporation chamber, and particles of the insulating material can be formed, and the particles can be deposited on a substrate in a film formation chamber. When the gas flow is properly designed, oxide particles can be formed by directly supplying the oxide gas to the evaporation chamber and them sprayed on the substrate. In this manner, the method according to the present invention can be applied to not only a semiconductor device but also other electronic parts.

As has been described above, according to the present invention, a metal film such as a wiring layer, a connection member for connecting wiring layers to each other, and a bump electrode is formed by spraying fine metal particles fed with an inert gas on a substrate, and a semiconductor device having stable characteristics can be provided by simple steps without using a complicate step. In addition, a metal film can be selectively formed on a substrate by controlling an incident angle of the fine metal particles without using a mask or a shielding plate. In addition, according to the present invention, an inert gas fed into an evaporation chamber can be rectified, the fine particle film in which large size particles are not mixed can be formed, thereby considerably improving the adhesion property of an underlying layer and the fine particle film.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A metal film forming apparatus comprising:
    a first vacuum chamber in which a crucible for heating and evaporating a material to be melted is arranged;
    means for supplying an inert gas into said first vacuum chamber;
    a second vacuum chamber in which a target substrate is arranged;
    means for feeding said inert gas from said first chamber to said second vacuum chamber; and
    means, arranged in said first chamber, for regulating a flow of said inert gas in said first chamber such that a normal erected on a central point of a surface of a molten material in said crucible is defined as an axis of symmetry of said flow of said inert gas when the material to be melted is heated and melted by said crucible.

2. An apparatus according to claim 1, wherein said regulating means feeds said inert gas into said first chamber through a space having an obstacle to a flow direction in a gas supply pipe used when said inert gas is fed into said first chamber.

3. An apparatus according to claim 2, wherein metal fibers are filled in said gas supply pipe as said obstacle so that said inert gas is supplied into said first chamber through opening area of said metal fiber.

4. An apparatus according to claim 2, wherein a distal end of said gas supply pipe has a ring-like cylindrical shape.

5. An apparatus according to claim 1, wherein a flow velocity of regulated inert gas is slower than that of fine particles which are produced by cooling steam evaporated from said surface of said molten material by means of said inert gas.

6. An apparatus according to claim 2, wherein said obstacle is a filter a main surface of which is made of stainless steel fibers in a mesh form.

* * * * *